(12) United States Patent
Akli et al.

(10) Patent No.: US 7,096,138 B2
(45) Date of Patent: Aug. 22, 2006

(54) METHOD FOR DEMONSTRATING THE DEPENDENCE OF A SIGNAL BASED ON ANOTHER SIGNAL

(75) Inventors: Florence Akli, Les Clayes Sous Bois (FR); Alain Debreil, Plaisir (FR); Christian Niquet, Bourg-La-Reine (FR)

(73) Assignee: Bull, S.A., Louveciennes (FR)

( * ) Notice: Subject to any disclaimer, the term of this patent is extended or adjusted under 35 U.S.C. 154(b) by 24 days.

(21) Appl. No.: 10/049,021

(22) PCT Filed: Jun. 7, 2001

(86) PCT No.: PCT/FR01/01765

§ 371 (c)(1),
(2), (4) Date: Feb. 8, 2002

(87) PCT Pub. No.: WO01/94961

PCT Pub. Date: Dec. 13, 2001

(65) Prior Publication Data

US 2002/0133318 A1    Sep. 19, 2002

(51) Int. Cl.
    G06F 17/50    (2006.01)
(52) U.S. Cl. .......................... 702/117; 716/4
(58) Field of Classification Search ............. 702/57, 702/58, 81–84, 108–110, 117–119, 128, 181–183, 702/185, 123; 703/2; 714/25, 30, 724, 811; 716/4, 5
See application file for complete search history.

(56) References Cited

U.S. PATENT DOCUMENTS 5,572,535 A    11/1996    Pixley et al.

OTHER PUBLICATIONS

Akers, Sheldon B. "Binary Decision Diagrams", Jun. 1978 IEEE Transactions on Computers vol. C-27, No. 6, pp. 509-516.*

Madre et al. "The Formal Verification Chain at Bull", May 29-Jun. 1, 1990 Euro ASIC '90, pp. 474-479.*

Lee et al. "Fast Parallel Algorithms for Model Checking Using BDDs", Apr. 13-16, 1993., Proceedings of Seventh International Parallel Processing Symposium. pp. 444-448.*

Stanion, T., "Tsunami: A Path Oriented Scheme for Algebraic Test Generation", International Symposium on Fault Tolerant Computing Systems, (FTCS), U.S., Los Alamitos, IEEE Comp. Soc. Press, vol. SYMP. 21, Jun. 25, 1991, pp. 36-43, XP000242690, ISBN: 0-8186-2150-8, the entire document.

Fummi, F., et al., "A Complete Testing Stragtegy Based on Interacting and Hierarchical FSM's", Integration, The VSLI Journal, NL, North-Holland Publishing Company, Amsterdam, vol. 23, No. 1, Oct. 1, 1997, pp. 75-93, XP004100336, ISSN: 0167-9260, the entire document.

Bryant, R.E., "Binary Decision Diagrams and Beyond: Enabling Technologies for Formal Verification", IEEE/ACM International Conference on Computer-Aided Design, U.S., Los Alamitos, IEEE Comp. Soc. Press, Nov. 5, 1995, pp. 236-243, XP000620913, ISBN: 0-8186-7213-7, the entire document.

Hojati, R., et al., "Early Quantification and Partitioned Transition Relations", Proceedings of the International Conference on Computer Design, ICCD, VLSI In Computers and Processors, U.S., Los Alamitos, IEEE Comp. Soc. Press, Oct. 7, 1996, pp. 12-19, XP000729882, ISBN: 0-8186-7554-3, the entire document.

* cited by examiner

*Primary Examiner*—Marc S. Hoff
*Assistant Examiner*—Manuel L. Barbee
(74) *Attorney, Agent, or Firm*—Miles & Stockbridge, P.C.; Edward J. Kondracki

(57) ABSTRACT

In order to test whether a given signal of a complex circuit has the correct behavior, a method is provided which makes it possible to obtain in a computer memory a profile of states of other signals. In order to minimize the processing time and the memory space required to obtain this profile, the method uses two binary decision diagrams starting with a binary variable of said one signal, each with two binary decision subdiagrams. The method combines the binary decision subdiagrams so that the given signal is in a first state when the binary variable is at a first value and is not in this first logical state when the binary variable is at a second value.

10 Claims, 7 Drawing Sheets

METHOD FOR DEMONSTRATING THE DEPENDENCE OF A SIGNAL BASED ON ANOTHER SIGNAL

CROSS REFERENCE TO RELATED APPLICATION

The subject matter of the subject invention is related to application Ser. No. 10/049,023 filed on Feb. 8, 2002, in the names of Florence AKLI, Alain DEBREIL and Christian NIQUET, entitled "TOOL FOR AUTOMATIC TESTABILITY ANALYSIS", the subject matter of which is incorporated herein in its entirety.

BACKGROUND OF THE INVENTION 1. Field of the Invention

The field of application of the invention is that of a method for indicating a combination of signals to be applied to a physical element in order to obtain a change in the state of a given signal following a change in the state of another signal on which the given signal depends.

2. Description of the Related Art

In complex physical elements, such as all or part of high-density integrated circuits, signals generated by these physical elements can depend on many other signals. It is therefore difficult to know if the physical element is behaving correctly.

Before etching into the silicon of electric circuits, the bad circuits must be detected in order to avoid using them. The technique used to sort the good circuits from the bad circuits is one that consists of applying stimuli to the circuit and comparing their responses to precalculated values.

In the case of a purely combinational circuit with two hundred inputs, it would be necessary to apply two to the power two hundred combinations of binary states in the inputs in order to test all the possible cases. A testing device operating at 50 MHz would take a thousand years to test a single circuit. These figures increase exponentially when there are stored states in the circuit.

It is therefore necessary to minimize the number of combinations of binary states to be applied to signals of the circuit in order to find the possible faults in the circuit.

For a first signal, normally generated by a physical element as a function of other signals applied to this physical element it is known from U.S. Pat. Nos. 5,434,794 and 5,737,242 to use binary decision diagrams to determine possible binary states of the first signal resulting from combinations of binary states of a second signal with binary states of third signals of the circuit.

The advantage of binary decision diagrams is that it is possible to represent in a computer memory, in a particularly compact way, the combinations of binary states of signals that lead to a given binary state of the first signal.

However, the binary decision diagrams of the prior art provide a static image of possible combinations of binary states of a second signal with third signals that produce a given binary state of the first signal. It is therefore possible for a combination of a first binary state of the second signal with binary states of third signals to produce the same given binary state of the first signal as a combination of a second binary state of the second signal with other binary states of third signals. Furthermore, it is possible to observe in the physical element either the given binary state of the first signal for the first binary state or the second binary state of the second signal, whereas the latter results not from binary combinations for which the physical element is designed, but from faults, such as a signal sticking in the physical element. Signal sticking means that a signal is in a state not intended by design, for example a state that results from a short circuit or from damage.

In order to ensure that the state of a first signal actually results from the state of a second signal, it is important to observe whether a state transition of the second signal induces a state transition of the first signal, the states of the other signals remaining unchanged. If, moreover, the transition of the first signal is does not match the transition expected, this may be interpreted as an error.

SUMMARY OF THE INVENTION

The subject of the invention is a method that associates, with a first signal generated by a physical element, two binary decision diagrams in two binary states of a second signal,
  the first binary decision diagram comprising:
    a first binary decision subdiagram that encodes a first set of the combinations of binary states of third signals for which the first signal is in a first binary state or in a second binary state when the second signal is in the first binary state,
    a second binary decision subdiagram that encodes a second set of the combinations of binary states of the third signals for which the first signal is in the first binary state or in the second binary state when the second signal is in the second binary state,
  the second binary decision diagram comprising:
    a third binary decision subdiagram that encodes a third set of the combinations of binary states of the third signals for which the first signal is in the second binary state or in a first nonbinary state when the second signal is in the first binary state,
    a fourth binary decision subdiagram that encodes a fourth set of the combinations of binary states of the third signals for which the first signal is in the second binary state or in the first nonbinary state when the second signal is in the second binary state.

The method includes at least one step that performs a logical combination of the first, second, and at least one of the third or fourth binary decision subdiagrams, said logical combination comprising a logical conjunction of three of said four binary decision subdiagrams wherein one of said three binary decision subdiagrams is complemented, in order to generate a fifth binary decision subdiagram that encodes a fifth set of combinations of binary states of said third signals.

If the complemented binary decision subdiagram is the first binary decision subdiagram, the fifth set of the combinations of binary states of said third signals is such that the first signal is not in the first binary state or the second binary state when the second signal is in the first binary state, a disjunction with the second and third uncomplemented binary decision subdiagrams makes the fifth set of combinations of binary states of said third signals such that the first signal is in the first nonbinary state or the second nonbinary state when the second signal is in the first binary state, and such that the first signal is in the first binary state or in the second binary state when the second signal is in the second binary state. Thus, when the second signal is in the second binary state, the first signal is in the first or the second binary state, and when the second signal passes to the first binary state, the first signal passes to the first nonbinary state.

If the complemented binary decision subdiagram is the second binary decision subdiagram, the fifth set of the combinations of binary states of said third signals is such that the first signal is not in the first state or the second binary state when the second signal is in the second binary state, a disjunction with the first and fourth uncomplemented binary decision subdiagrams makes the fifth set of combinations of binary states of said third signals such that the first signal is in the first nonbinary state or the second binary state when the second signal is in the second binary state, and such that the first signal is in the first binary state or in the second binary state when the second signal is in the first binary state. Thus, when the second signal is in the first binary state, the first signal is in the first or the second binary state, and when the second signal passes to the second binary state, the first signal passes to the first nonbinary state.

If the complemented binary decision subdiagram is the third binary decision subdiagram, the fifth set of the combinations of binary states of said third signals is such that the first signal is not in the first binary state or the first nonbinary state when the second signal is in the first binary state, a disjunction with the first and second uncomplemented binary decision subdiagrams makes the fifth set of combinations of binary states of said third signals such that the first signal is in the first binary state or the second binary state when the second signal is in the second binary state, and such that the first signal is in the first binary state or in the second binary state when the second signal is in the first binary state. Thus, when the second signal is in the first binary state, the first signal is in the second binary state, and when the second signal passes to the second binary state, the first signal passes to the first nonbinary state.

Thus, in order to test whether a given signal of a complex circuit has the correct behavior, the method makes it possible to obtain in a computer memory a profile of states of other signals, among which a change in the state of one signal must cause a change in the state of the given signal, in a physical sample of the circuit. In order to minimize the processing time and the memory space required to obtain this profile, the method uses two binary decision diagrams starting with a binary variable of said one signal, each with two binary decision subdiagrams. The method combines the binary decision subdiagrams in such a way that the given signal is in a first state when the binary variable is at a first value and is not in this first state when the binary variable is at a second value.

BRIEF DESCRIPTION OF THE DRAWINGS

Other details and advantages of the invention will be more clearly understood in the following description in reference to the figures, in which.

DESCRIPTION OF THE PREFERRED EMBODIMENTS

Figure 1:
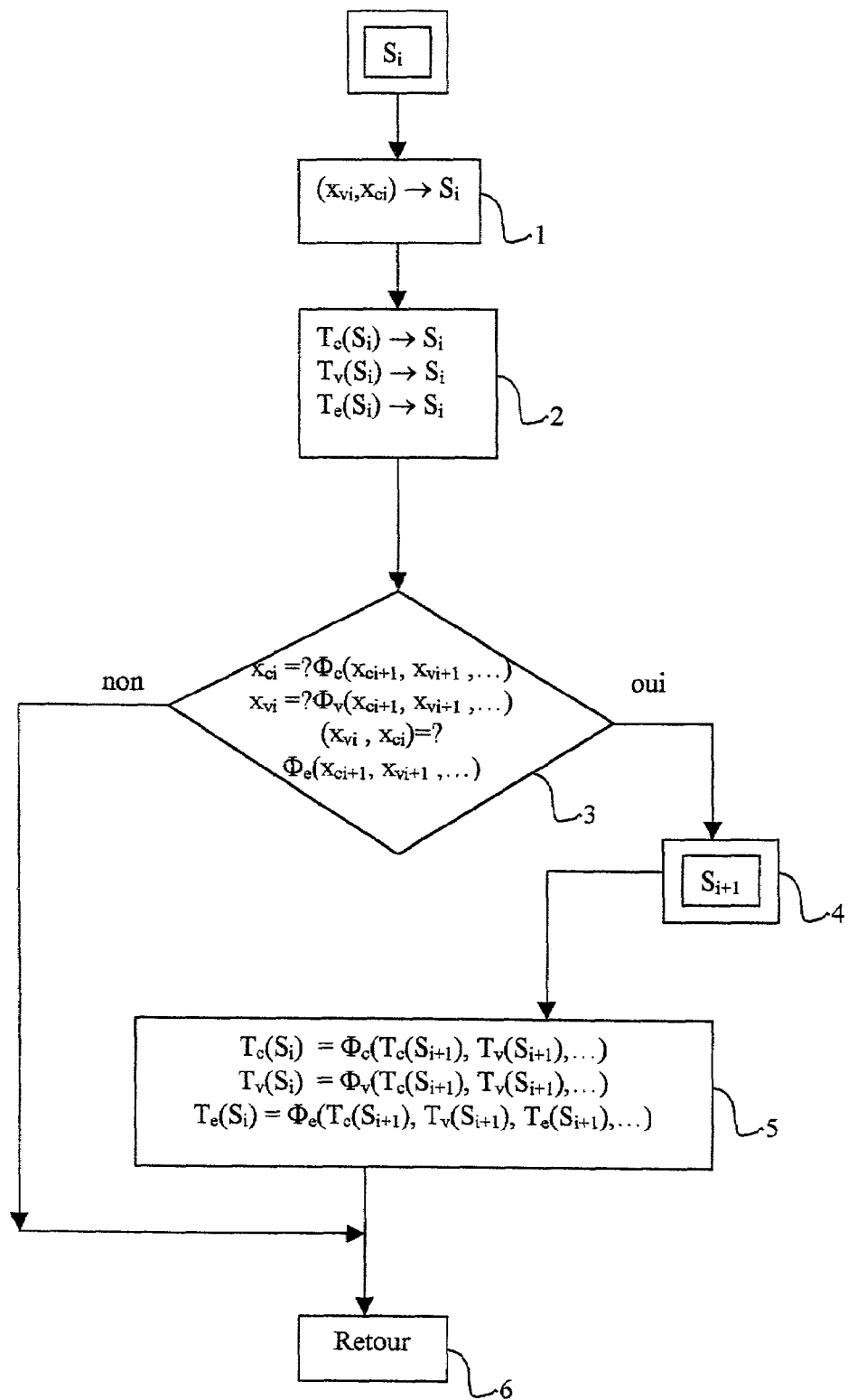
FIG. 1 represents steps of a method for associating with a first signal at least two binary decision diagrams.

FIG. 1 represents steps of a method for associating with a first signal $S_i$ at least two binary decision diagrams. These steps are executed by a computer that has in memory a connection list (netlist) of signals and physical elements that determines various relations between these signals. The intermediate and final results of the steps are automatically stored in memory in the computer.

In a first step 1, a pair of binary variables $(x_{vi}, x_{ci})$ is assigned to a signal $S_i$ in order to encode at least three possible states of the signal $S_i$. The variable $x_{ci}$, called a context variable, is defined in order to indicate that, when its value is equal to 1, the values 0 and 1 of the variable $x_{vi}$, respectively, directly encode a first logical state B and a second logical state H of the signal $S_i$. When the value of the context variable $x_{ci}$ is equal to 0, the values 0 and 1 of the variable $x_{vi}$ respectively encode an indeterminate state and a state Z of the signal $S_i$. The state Z of the signal $S_i$ is a high-impedance state in the sense in which the term is usually understood in an electric circuit. In the indeterminate state, there is an error state E of the signal $S_i$ such as, for example, an electrical short circuit. The pair of binary variables $(x_{vi}, x_{ci})$ thus makes it possible to encode four possible states of the signal $S_i$.

In a second step 2, three binary decision diagrams $T_v(S_i)$, $T_c(S_i)$, $T_e(S_i)$ are assigned to the signal $S_i$.

The so-called context binary decision diagram $T_c(S_i)$ is constructed by means of a rule Rc, so that it leads to 1 if the state of the signal $S_i$ is the logical state B or the logical state H.

The so-called value binary decision diagram $T_v(S_i)$ is constructed by means of a rule Rv, so that it leads to 1 if the state of the signal $S_i$ is the high-impedance state Z or the logical state H.

The so-called error binary decision diagram $T_e(S_i)$ is constructed by means of a rule Re, so that it leads to 1 if the state of the signal $S_i$ is an error state.

The application of a rule Rc, Rv Re activates a third step 3, which scans the netlist in order to determine a combination $\Phi_c$, $\Phi_v$, $\Phi_e$, that links the states of the signals $S_i$ to the states of one or more other signals $S_{i+1}$, $S_{i+2}$.

When the signal $S_i$ does not depend on any other signal, each of the variables $x_{vi}$, $x_{ci}$ of the pair of variables $(x_{vi}, x_{ci})$ can assume a value equal to 0 or 1. This is the case, for example, for an input signal of the electric circuit or for an intermediate signal that it is possible to force by means of a test probe. The binary decision diagrams $T_v(S_i)$, $T_c(S_i)$ are such that $T_v(S_i)$ leads to 1 if $x_{vi}$ is equal to 1, and $T_c(S_i)$ leads to 1 if $x_{ci}$ is equal to 1. The binary decision diagrams then being constructed immediately, an end step 6 is activated.

When the signal $S_i$ depends on one or more signals $S_{i+1}$, $S_{i+2}$, a fourth step 4 makes the binary decision diagrams associated with the signal $S_{i+1}$, $S_{i+2}$ available. If the binary decision diagrams already exist in memory, this consists in a simple reading of pointers in these binary decision diagrams. If the binary decision diagrams do not exist in memory, it consists of reactivating the method recursively for the signal or signals $S_{i+1}$, $S_{i+2}$, etc.

A step 5 then combines the binary decision diagrams using the combinations determined in step 3.

Let us recall that a binary decision diagram $T_f$ associated with a first boolean function $f(a, b, c, \ldots, w)$ of binary variables a, b, c, ... w is accessible by means of a first computer data structure that makes it possible to represent in memory the values assumed by the first function f, based on the values assumed by the binary variables a, b, c, ... w. This first data structure is constructed using the known properties of a Shannon decomposition relative to a first variable a, i.e., using the usual notations for writing logical functions:

where $f(a=0, b, c, \ldots, w)$ is a second invariable boolean function based on a, since a is set at zero, and where $f(a=1, b, c, \ldots, w)$ is a third invariable boolean function based on a since a is set at one. The second boolean function assumes the same values as the first boolean function based on the values assumed by the binary variables b, c, ..., w when a=0. The third boolean function assumes the same values as the first boolean function based on the values assumed by the binary variables b, c, ..., w when a=1. The first data structure therefore appears as a triplet of addresses of storage areas $\{a, f(a=0,b, \ldots), f(a=1,b, \ldots)\}$, which therefore comprises a first node occupied by the first variable a, a left pointer to a second data structure $\{b, f(a=0, b=0, \ldots), f(a=0,b=1, \ldots)\}$ that makes it possible to access a first binary decision subdiagram associated with the second boolean function and a right pointer to a third data structure $\{b, f(a=1, b=0, \ldots), f(a=1, b=1, \ldots)\}$ that makes it possible to access a second binary decision subdiagram associated with the third boolean function. The second and third data structures being the same type as the first data structure with, respectively, a second and third node occupied by a second binary variable b, c. The above operation is repeated until the last binary variable w gives the binary decision diagram $T_f$ constituted by a chaining $\{a, \{b, \{\ldots\}, \{\ldots\}\}, \{b, \{\ldots\}, \{\ldots\}\}\}$ of the structures by means of the pointers. An identifier of the binary decision diagram $T_f$ points to the first node, called the root node.

The representation in memory of a function by a binary decision diagram offers the appreciable advantage of compactness because, if two or more binary decision subdiagrams are identical, only one representation in memory is enough, since two or more pointers can point to the same data structure. When a function is independent of a binary variable, the binary decision diagram is simplified. The representation in memory of a function by a binary decision diagram can be implicit in the sense that it is possible to perform calculations on the root node without necessarily extending the binary decision diagram for all of the nodes.

One advantageous property of binary decision diagrams results from the following statement on the Shannon decomposition. When a boolean function $h(a,b,c, \ldots, z)$ results from a combinational operation $\Phi(f,g)$ of one or more boolean functions $f(a,b,c, \ldots, w)$, $g(a,b,c, \ldots, w)$:

$h(a,b,c, \ldots, w) = \overline{a} \cdot h(a=0,b,c, \ldots, w) + a \cdot h(a=1,b,c, \ldots, w)$ $= \overline{a} \cdot \Phi(f(a=0,b,c, \ldots, w), g(a=0,b,c, \ldots, w)) + a \cdot \Phi(f(a=1,b,c, \ldots, w), g(a=1,b,c, \ldots, w))$ $= \Phi(\overline{a} \cdot f(a=0,b,c, \ldots, w), \overline{a} \cdot g(a=0,b,c, \ldots, w)) + \Phi(a \cdot f(a=1,b,c, \ldots, w), a \cdot g(a=1,b,c, \ldots, w))$ $= \Phi(\overline{a} \cdot f(a=0,b,c, \ldots, w) + a \cdot f(a=1,b,c, \ldots, w), \overline{a} \cdot g(a=0,b,c, \ldots, w) + a \cdot g(a=1,b,c, \ldots, w))$ For example:

When $\Phi$ is a logical complement, $h(a, b, c, \ldots, w) = \overline{f}(a, b, c, \ldots, w)$ $\overline{f}(a, b, c, \ldots, w) = \overline{\overline{a} \cdot f(a=0, b, c, \ldots, w) + a \cdot f(a=1, b, c, \ldots, w)}$ $= \overline{[\overline{a} \cdot f(a=0, b, c, \ldots, w)] \cdot [a \cdot f(a=1, b, c, \ldots, w)]}$ $= [a + \overline{f(a=0, b, c, \ldots, w)}] \cdot [\overline{a} + \overline{f(a=1, b, c, \ldots, w)}]$ $= \overline{a} \cdot \overline{f}(a=0, b, c, \ldots, w) + a \cdot \overline{f}(a=1, b, c, \ldots, w)$ The binary decision diagram associated with the logical complement of a function f includes the same node occupied by the variable a as the binary decision diagram associated with the function f in which the pointer in the binary decision subdiagram associated with the function f for a equal to zero is replaced by a pointer in a binary decision subdiagram associated with the logical complement of the function f for a equal to zero, and in which the pointer in the binary decision subdiagram associated with the function f for a equal to one is replaced by a pointer in a binary decision subdiagram associated with the logical complement of the function f for a equal to one.

When $\Phi$ is a logical disjunction of two functions f and g, $h(a,b,c, \ldots, w) = f(a,b,c, \ldots, w) \cdot g(a,b,c \ldots, w)$ $= \overline{a} \cdot [f(a=0,b,c, \ldots, w) \cdot g(a=0,b,c, \ldots, w)] + a \cdot [f(a=1, b,c, \ldots, w) + g(a=1,b,c, \ldots, w)]$ The binary decision diagram associated with the logical disjunction of two functions f and g includes the same node occupied by the variable a as the binary decision diagram associated with the function f in which the pointer in the binary decision subdiagram associated with the function f for a equal to zero is replaced by a pointer in a binary decision subdiagram associated with the logical disjunction of the function f for a equal to zero and the function g for a equal to zero, and in which the pointer in the binary decision subdiagram associated with the function f for a equal to one is replaced by a pointer in a binary decision subdiagram associated with the logical disjunction of the function f for a equal to one and the function g for a equal to one.

When $\Phi$ is a logical conjunction of two functions f and g, $h(a,b,c, \ldots, w) = f(a,b,c, \ldots, w) \cdot g(a,b,c, \ldots, w)$ $= \overline{a} \cdot [f(a=0,b,c, \ldots, w) \cdot g(a=0,b,c, \ldots, w)] + a \cdot [f(a=1, b,c, \ldots, w) \cdot g(a=1,b,c, \ldots, w)]$ The binary decision diagram associated with the logical conjunction of two functions f and g includes the same node occupied by the variable a as the binary decision diagram associated with the function f in which the pointer in the binary decision subdiagram associated with the function f for a equal to zero is replaced by a pointer in a binary decision subdiagram associated with the logical conjunction of the function f for a equal to zero and the function g for a equal to zero, and in which the pointer in the binary decision subdiagram associated with the function f for a equal to one is replaced by a pointer in a binary decision subdiagram associated with the logical conjunction of the function f for a equal to one and the function g for a equal to one.

By proceeding recursively up to the last variable w of one or more functions f, g, it is possible to perform, in a simple way, any combinational operation $\Phi$ of one or more binary decision diagrams.

The binary decision diagram $T_c(S_i)$ is constructed by means of the combination $\Phi_c$, which gives $T_v(S_i)$ by replacing $x_{vi+1}$, $x_{ci+1}$, $x_{vi+2}$, $x_{ci+2}$, respectively, with the binary decision diagrams $T_v(S_{i+1})$, $T_c(S_{i+1})$, $T_e(S_{i+1})$, $T_v(S_{i+2})$, $T_c(S_{i+2})$, $T_e(S_{i+2})$;

The binary decision diagram $T_v(S_i)$ is constructed by means of the combination $\Phi_v$, which gives $T_v(S_i)$ by replacing $x_{vi+1}$, $x_{ci+1}$, $x_{vi+2}$, $x_{ci+2}$, respectively, with the binary decision diagrams $T_v(S_{i+1})$, $T_c(S_{i+1})$, $T_v(S_{i+1})$, $T_v(S_{i+2})$, $T_c(S_{i+2})$;

The binary decision diagram $T_e(S_i)$ is constructed likewise by combining the binary decision diagrams $T_v(s_{i+1})$, $T_c(s_{i+1})$, $T_e(s_{i+1})$, $T_v(s_{i+2})$, $T_c(s_{i+2})$, $T_e(s_{i+2})$.

Let's apply, for example, the method described above to the elementary circuit of FIG. 3, which constitutes a multiplexer with three inputs.

A conductor 21 conveys a signal $S_1$. The conductor 21 is connected at a point 25 to three conductors 22, 23, 24 in parallel. The conductors 22, 23, 24 each convey a signal, respectively $S_2$, $S_3$, $S_4$. The coupling of the signals $S_2$, $S_3$ at the point 25 is equivalent to an intermediate signal $S_{11}$ coupled at the point 25 with the signal $S_4$.

The variable $x_{v1}$ is equal to 1 if and only if the state of each of the signals $S_2$, $S_3$, $S_4$ is the high-impedance state Z or the logical state H.

The applicable rule $R_v$ for constructing the binary decision diagram $T_v(S_{11})$ is a rule $R_{vr}$ for two conductors coupled at the same point 25:

$$T_v(S_{11}) = T_v(S_2) \cdot T_v(S_3).$$

$T_v(S_{11})$ now being present in memory, the rule $R_{vr}$ is again applied to $S_{11}$ and $S_4$.

$$T_v(S_1) = T_v(S_{11}) \cdot T_v(S_4).$$

An error occurs in the signal $S_{11}$ if one of the signals $S_2$, $S_3$ is in the logical state H while the other signal $S_3$, $S_2$ is in the logical state B, or if one of the signals $S_2$, $S_3$ is in the error state.

The applicable rule $R_v$ for constructing the binary decision diagram $T_e(S_{11})$ is a rule $R_{er}$ for two conductors coupled at the point 25:

$$Te(s11) = Tc(s2) \cdot Tc(s3) \cdot \lfloor Tv(s2) \cdot \overline{Tv(s3)} + \overline{Tv(s2)} \cdot Tv(s3) \rfloor + Te(s2) + Te(s3)$$

An error occurs in the signal $S_1$ if one of the signals $S_{11}$, $S_4$ is in the logical state H while the other signal $S_4$, $S_{11}$ is in the logical state B, or if one of the signals $S_{11}$, $S_4$ is in the error state.

The rule $R_{er}$ is again applicable for constructing the binary decision diagram $T_e(S_1)$.

$$Te(s1) = Tc(s11) \cdot Tc(s4) \cdot \lfloor Tv(s11) \cdot \overline{Tv(s4)} + \overline{Tv(s11)} \cdot Tv(s4) \rfloor + Te(s11) + Te(s4)$$

The variable $xc_1$ is equal to 1 if the state of the signal $S_1$ is the logical state B or the logical state H. The signal $S_{11}$ is in the state B or H if and only if the signal $S_2$ or the signal $S_3$ is in the logical state B or H and if no error results from the signals $S_2$ and $S_3$ in the signal $S_{11}$. The applicable rule $R_c$ for constructing the binary decision diagram $T_c(S_{11})$ is a rule $R_{cr}$ for two conductors coupled at the point 25:

$$Tc(s11) = [Tc(s2) + Tc(s3)] \cdot \lfloor \overline{Tc(s2) \cdot Tc(s3) \cdot [Tv(s2) \cdot \overline{Tv(s3)} + \overline{Tv(s2)} \cdot Tv(s3)]} \rfloor$$

$$Tc(s11) = [Tc(s2) + Tc(s3)] \cdot \lfloor \overline{Tc(s2)} + \overline{Tc(s3)} + \lfloor \overline{Tv(s2)} + Tv(s3) \rfloor \cdot \lfloor Tv(s2) + \overline{Tv(s3)} \rfloor \rfloor$$

$$Tc(s11) = +Tc(s2) \cdot [\overline{Tc(s3)} + \overline{Tv(s2)} \cdot \overline{Tv(s3)} + Tv(s2) \cdot Tv(s3)] + Tc(s3) \cdot [\overline{Tc(s2)} + \overline{Tv(s2)} \cdot \overline{Tv(s3)} + Tv(s2) \cdot Tv(s3)]$$

The rule $R_{cr}$ is again applied for the signals $S_{11}$ and $S_4$:

$$Tc(s1) = +Tc(s11) \cdot [\overline{Tc(s4)} + \overline{Tv(s11)} \cdot \overline{Tv(s4)} + Tv(s11) \cdot Tv(s4)] + Tc(s4) \cdot [\overline{Tc(s11)} + \overline{Tv(s11)} \cdot \overline{Tv(s4)} + Tv(s11) \cdot Tv(s4)]$$

If for $S_2$, $T_v(S_2)$, $T_c(S_2)$, $T_e(S_2)$ are not present in memory, the second step is repeated for the signal $S_2$.

The conductor 22 is coupled to the drain of an N-type MOS transistor 27. The grid of the transistor 27 receives a signal $S_5$ and the source of the transistor 27 receives a signal $S_6$. In CMOS technology, the concept of a drain, and of a source, of a transistor is tied in a known way to its operating state; these two concepts are also interchangeable.

The signal $S_2$ is in the logical state H if and only if the signals $S_5$ and $S_6$ are in the logical state H. The signal $S_2$ is in the high-impedance state Z if and only if the signal $S_5$ is in the logical state B or if the signal $S_5$ is in the logical state H and the signal $S_6$ is in the high-impedance state Z. The rule $R_v$ that is applied is a rule $R_{vn}$:

$$Tv(s2) = [Tc(s5) \cdot Tv(s5) \cdot Tc(s6) \cdot Tv(s6) + Tc(s5) \cdot \overline{Tv(s5)}] + Tc(s5) \cdot Tv(s5) \cdot \overline{Tc(s6)} \cdot Tv(s6)$$

Which with simplification yields:

$$Tv(s2) = [Tc(s5) \cdot Tv(s5) \cdot Tv(s6) + Tc(s5) \cdot \overline{Tv(s5)}]$$

The signal $S_2$ is in the error state E if the signal $S_5$ is in the high-impedance state Z. In fact, a transistor grid hit by a high-impedance signal is particularly noise-sensitive. The rule $R_e$ that is applied is a rule $R_{en}$:

$$Te(s2) = Tv(s5) \cdot \overline{Tc(s5)}$$

The signal $S_2$ is in the logical state B or H if and only if the signal $S_5$ is in the logical state H and the signal $S_6$ is in the logical state B or H. The rule $R_c$ that is applied is a rule $R_{cn}$:

$$Tc(s2) = Tc(s5) \cdot Tv(s5) \cdot Tc(s6)$$

If for $S_4$, $T_v(S_4)$, $T_c(S_4)$, $T_e(S_4)$ are not present in memory, the second step is repeated for the signal $S_4$.

The conductor 23 is coupled to the drain of an N-type MOS transistor 26. The grid of the transistor 26 receives a signal $S_7$ and the source of the transistor 26 receives a signal $S_8$.

The first two steps are executed for the signal $S_3$ using the same rules $R_{vn}$, $R_{cn}$ and $R_{en}$ as for the signal $S_2$ in order to obtain:

$$Tv(s3) = [Tc(s7) \cdot Tv(s7) \cdot Tv(s8) + Tc(s7) \cdot \overline{Tv(s7)}]$$

$$Te(s3) = Tv(s7) \cdot \overline{Tc(s7)}$$

$$Tc(s3) = Tc(s7) \cdot Tv(s7) \cdot Tc(s8)$$

The conductor 24 is coupled to the drain of a P-type MOS transistor 29. The grid of the transistor 29 receives a signal $S_9$ and the source of the transistor 27 receives a signal $S_{10}$.

The signal $S_4$ is in the logical state H if and only if the signals $S_9$ and $S_{10}$ are respectively in the logical state B and H. The signal $S_4$ is in the high-impedance state Z if and only if the signal $S_9$ is in the logical state H or if the signal $S_9$ is in the logical state B and the signal $S_{10}$ is in the high-impedance state Z. After simplification, the rule $R_v$ that is applied is a rule $R_{vp}$:

$$Tv(s4) = [Tc(s9) \cdot \overline{Tv(s9)} \cdot Tv(s10) + Tc(s9) \cdot Tv(s9)]$$

The signal $S_4$ is in the error state E if the signal $S_9$ is in the high-impedance state Z. In fact, a transistor grid hit by a high-impedance signal is particularly noise-sensitive. The rule $R_e$ that is applied is a rule $R_{ep}$:

$$Te(s4)=Tv(s9)\cdot \overline{Tc(s9)}$$

The signal $S_4$ is in the logical state B or H if and only if the signal $S_9$ is in the logical state B and the signal $S_{10}$ is in the logical state B or H. The rule $R_c$ that is applied is a rule $R_{cp}$:

$$Tc(s4)=Tc(s9)\cdot \overline{Tv(s9)}\cdot Tc(s10)$$

Thus, the binary decision diagrams $T_v(S_1)$, $T_c(S_1)$, $T_e(S_1)$ are obtained as a function of the binary decision diagrams $T_v(S_5)$, $T_c(S_5)$, $T_v(S_6)$, $T_c(S_6)$, $T_v(S_7)$, $T_c(S_7)$, $T_v(S_8)$, $T_c(S_8)$, $T_v(S_9)$, $T_c(S_9)$, $T_v(S_{10})$, $T_c(S_{10})$.

If one is interested in the possible states of the signal $S_1$, for two possible logical states B and H of each of the signals $S_5$ through $S_{10}$, the third step is executed, wherein each of the binary decision diagrams $T_c(S_5)$, $T_c(S_6)$, $T_c(S_7)$, $T_c(S_8)$, $T_c(S_9)$, $T_c(S_{10})$ equals 1 and wherein each of the binary decision diagrams $T_v(S_5)$, $T_v(S_6)$, $T_v(S_7)$, $T_v(S_8)$, $T_v(S_9)$, $T_v(S_{10})$ is replaced, respectively, by each of the binary decision diagrams $\{x_{v5};0;1\}$, $\{x_{v6};0;1\}$, $\{x_{v7};0;1\}$, $\{x_{v8};0;1\}$, $\{x_{v9};0;1\}$, $\{x_{v10};0;1\}$. Thus, three binary decision diagrams $T_v(S_1)$, $T_c(S_1)$, $T_e(S_1)$ are obtained with nodes occupied by the variables $x_{v5}$, $x_{v6}$, $x_{v7}$, $x_{v8}$, $x_{v9}$, $x_{v10}$ and with leaves at 0 or at 1.

In order to know, for example, which values of $x_{v5}$, $x_{v6}$, $x_{v7}$, $x_{v8}$, $x_{v9}$, $x_{v10}$ put the signal $S_1$ in the logical state H, a binary decision diagram $T_1(S_1)$ is constructed using the rule $R_1$:

$$T1(s1)=Tv(s1)\cdot Tc(s1)\cdot \overline{Te(s1)}$$

Figure 3:
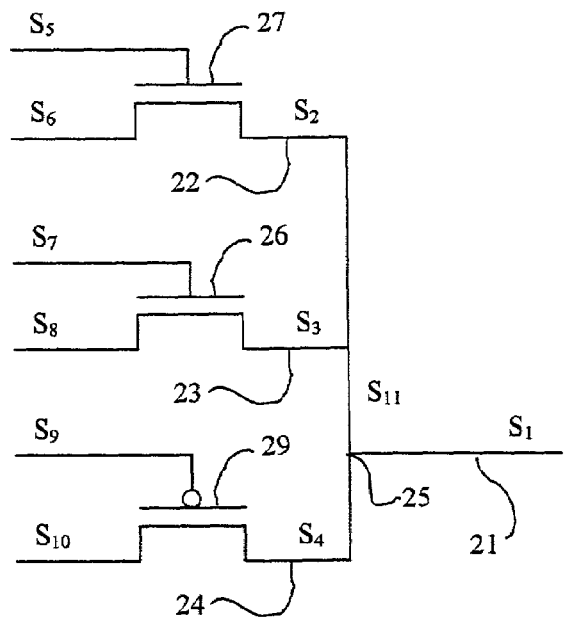
FIGS. 3 and 4 represent physical elements for understanding the effect of the method on a simple example.

The binary decision diagram $T_1(S_1)$ is scanned through each branch leading from the node occupied by the variable $x_{v5}$, to a leaf occupied by the value 1, saving in a logical conjunction each variable $x_{v5}$, $x_{v6}$, $x_{v7}$, $x_{v8}$, $x_{v9}$, $x_{v10}$ encountered, as is if the scanning of the branch is done by means of the right pointer and complemented if the scanning of the branch is done by means of the left pointer. Each logical conjunction obtained by the scan through a branch is saved in a logical disjunction until all of the branches leading to a leaf occupied by the value 1 have been scanned. Thus, a logical equation of the circuit of FIG. 3 is obtained:

$$s1=+s5\cdot s6\cdot s7\cdot s8\cdot \overline{s9}\cdot s10+s5\cdot s6\cdot s7\cdot s8\cdot s9+s5\cdot s6\cdot \overline{s7}\cdot \overline{s9}\cdot s10\\+\overline{s5}\cdot s7\cdot s8\cdot s9+\overline{s5}\cdot s7\cdot s8\cdot \overline{s9}\cdot s10+\overline{s5}\cdot \overline{s7}\cdot\\\overline{s9}\cdot s10+s5\cdot s6\cdot s7\cdot \overline{s9}$$

Let's apply, for example, the method described above to the elementary circuit of FIG. 4, wherein five input signals $S_{16}$, $S_{17}$, $S_{18}$, $S_{19}$, $S_{21}$ are combined so as to generate a signal $S_{12}$.

Figure 4:
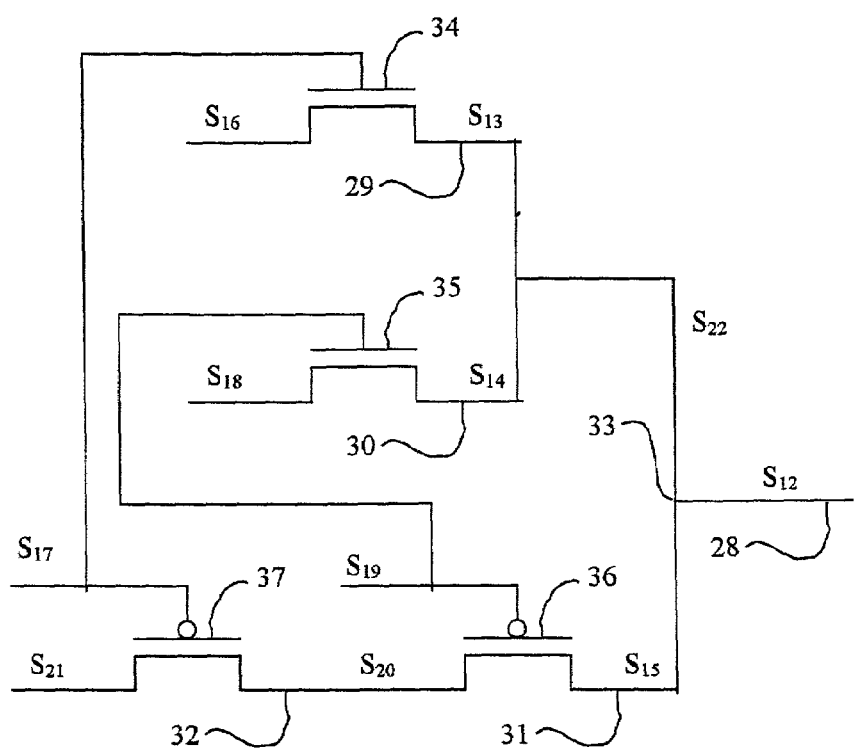

The elementary circuit entity of FIG. 4 comprises two NMOS transistors 34 and 35, whose sources are respectively hit by the signals $S_{16}$ and $S_{18}$, whose grids are respectively hit by the signals $S_{17}$ and $S_{19}$, and whose drains respectively generate signals $S_{13}$ and $S_{14}$ in conductors 29 and 30. The elementary circuit entity of FIG. 4 also comprises two PMOS transistors 37 and 36, whose sources are respectively hit by the signal $S_{21}$, and a signal $S_{20}$, whose grids are respectively hit by the signals $S_{17}$ and $S_{19}$, and whose drains respectively generate the signal $S_{20}$ and a signal $S_{15}$ in conductors 32 and 31. The conductors 29, 30 and 31 are connected to a conductor 28 at a point 33.

The fifth step scans each of the signals $S_{16}$, $S_{17}$, $S_{18}$, $S_{19}$, $S_{21}$ of the netlist and for each signal scanned, executes the first two steps.

In the case where the sources of the transistors 34 and 35 are connected to the ground, the binary decision diagrams $T_v(S_{16})$, $T_c(S_{16})$, $T_e(S_{16})$, $T_v(S_{18})$, $T_c(S_{18})$, $T_e(S_{18})$ are respectively equal to the singletons $\{0\}$, $\{1\}$, $\{0\}$, $\{0\}$, $\{1\}$, $\{0\}$. In the case where the source of the transistor 37 is connected to the supply, the binary decision diagrams $T_v(S_{21})$, $T_c(S_{21})$, $T_e(S_{21})$ are respectively equal to the singletons $\{1\}$, $\{1\}$, $\{0\}$. In the case where the grids of the transistors 34 and 37 are connected to an input, necessarily set to a logical state 0 or 1, the binary decision diagrams $T_v(S_{17})$, $T_c(S_{17})$, $T_e(S_{17})$ are respectively $\{x_{v17},0,1\}$, $\{1\}$, $\{0\}$. In the case where the grids of the transistors 35 and 36 are connected to an input, necessarily set to a logical state B or H, the binary decision diagrams $T_v(S_{19})$, $T_c(S_{19})$, $T_e(S_{19})$ are respectively $\{x_{19},0,1\}$, $\{1\}$, $\{0\}$. The elements of the elementary circuit hit by the signals $s_{16}$, $s_{17}$, $s_{18}$, $s_{19}$, $s_{21}$ of the net list are then scanned, in order to associate with the transistors 34, 35, 37, respectively, the signals $S_{13}$, $S_{14}$, $S_{15}$, for each of which steps 1 through 5 are executed.

For the transistor 34, the rules $R_{vn}$, $R_{cn}$ $R_{en}$ are applied to the signal $S_{13}$, in the second step.

$$Tv(s13)=[Tc(s17)\cdot Tv(s17)\cdot Tv(s16)+Tc(s17)\cdot \overline{Tv(s17)}]$$

$$Tc(s13)=Tc(s17)\cdot Tv(s17)\cdot Tv(s16)$$

$$Te(s13)=Tv(s17)\cdot \overline{Tc(s17)}$$

Which yields, when applying the known rules for combining binary decision diagrams:

$$T_v(S_{13})=\{x_{v17},1,0\}$$

$$T_c(S_{13})=\{x_{v17},0,1\}$$

$$T_e(S_{13})=\{0\}$$

For the transistor 35, the rules $R_{vn}$, $R_{cn}$ $R_{en}$ are applied to the signal $S_{14}$, in the second step, so as to yield, in identical fashion:

$$T_v(S_{14})=\{x_{v19},1,0\}$$

$$T_c(S_{14})=\{x_{v19},0,1\}$$

$$T_e(S_{14})=\{0\}$$

For the transistor 37, the rules $R_{vp}$, $R_{cp}$ $R_{ep}$ are applied to the signal $S_{20}$, in the second step.

$$Tv(s20)=[Tc(s17)\cdot \overline{Tv(s17)}\cdot Tv(s21)+Tc(s17)\cdot Tv(s17)]$$

$$Tc(s20)=Tc(s17)\cdot \overline{Tv(s17)}\cdot Tc(s21)$$

$$Te(s20)=Tv(s17)\cdot \overline{Tc(s17)}$$

Which yields, when applying the known rules for combining binary decision diagrams:

$$T_v(S_{20})=\{1\}$$

$$T_c(S_{20})=\{x_{v17},1,0\}$$

$$T_e(S_{20})=\{0\}$$

The sixth step is re-activated in order to scan the elements of the elementary circuit hit by the previously generated signals $S_{13}$, $S_{14}$, $S_{20}$ of the net list, and associates with these elements, which are the point 33 and the transistor 36, respectively the signals $S_{22}$ and $S_{15}$, for each of which it executes the first two steps.

For the point 33, the rules $R_{vr}$, $R_{cr}$ $R_{en}$ are applied to the signal $S_{22}$, in the second step.

$$Tv(S_{22})=Tv(S_{13}) \cdot Tv(S_{14})$$

$$Tc(s22)=+Tc(s13) \cdot [\overline{Tc(s14)}+\overline{Tv(s13)} \cdot \overline{Tv(s14)}+Tv(s13) \cdot Tv(s14)]+Tc(s14) \cdot [\overline{Tc(s13)}+\overline{Tv(s13)} \cdot \overline{Tv(s14)}+Tv(s13) \cdot Tv(s14)]$$

$$Te(s22)=Tc(s13) \cdot Tc(s14) \cdot [Tv(s13) \cdot \overline{Tv(s14)}+\overline{Tv(s13)} \cdot Tv(s14)]$$

Which yields, when applying the known rules for combining binary decision diagrams:

$$T_v(S_{22})=\{x_{v17},\{x_{v19},1,0\},0\}$$

$$T_c(S_{22})=\{x_{v17},\{x_{v19},0,1\},1\}$$

$$T_e(S_{22})=\{x_{v17},0\{x_{v19},0,0\}\}=\{0\}$$

For the transistor 36, the rules $R_{vp}$, $R_{cp}$ $R_{ep}$ are applied to the signal $S_{15}$, in the second step.

$$Tv(s15)=[Tc(s19) \cdot \overline{Tv(s19)} \cdot Tv(s20)+Tc(s19) \cdot Tv(s19)]$$

$$Tc(s15)=Tc(s19) \cdot \overline{Tv(s19)} \cdot Tc(s20)$$

$$Te(s15)=Tv(s19) \cdot \overline{Tc(s19)}$$

Which yields, when applying the known rules for combining binary decision diagrams:

$$T_v(S_{15})=\{1\}$$

$$T_c(S_{15})=\{xv_{17},\{x_{v19},1,0\},0\}$$

$$T_e(S_{15})=\{0\}$$

The sixth step is re-activated in order to scan the elements of the elementary circuit hit by the previously generated signals $S_{22}$, $S_{15}$ of the netlist and associates with the only element found, which is the point 33, the signal $S_{12}$, for which it executes the first two steps.

For the point 33, the rules $R_{vr}$, $R_{cr}$, $R_{er}$ are applied to the signal $S_{12}$, in the second step.

$$Tv(S_{12})=Tv(S_{22}) \cdot Tv(S_{15})$$

$$Tc(s12)=+Tc(s22) \cdot [\overline{Tc(s15)}+\overline{Tv(s22)} \cdot \overline{Tv(s15)}+Tv(s22) \cdot Tv(s15)]+Tc(s15) \cdot [\overline{Tc(s22)}+\overline{Tv(s22)} \cdot \overline{Tv(s15)}+Tv(s22) \cdot Tv(s15)]$$

$$Te(s12)=Tc(s22) \cdot Tc(s15) \cdot [Tv(s22) \cdot \overline{Tv(s15)}+\overline{Tv(s22)} \cdot Tv(s15)]$$

Which yields, when applying the known rules for combining binary decision diagrams:

$$T_v(S_{12})=\{x_{v17},\{x_{v19},1,0\},0\}$$

$$T_c(S_{12})=\{x_{v17},1,\{x_{v19},1,1\}\}=\{1\}$$

$$T_e(S_{12})=\{x_{v17},0,\{x_{v19},0,0\}\}=\{0\}$$

The only remaining signal being the signal $S_{12}$, the fourth step yields the binary decision diagram $T_{log}(S12)$ using the rule $R_{log}$:

$$T_{log}(S_{12})=T_v(S_{12}) \cdot T_c(S_{12})$$

$$=\{x_{v17},\{x_{v19},1,0\},0\}$$

The binary variable $x_{v12}$ is in the logical state 1 for the branches of the binary decision diagram $T_{log}(S_{12})$ that lead to 1. This is written:

$$xv12 = \overline{xv17} \cdot \overline{xv19}$$

In the fourth step, the circuit of FIG. 4 is recognized as being a NOR gate.

Figure 2:
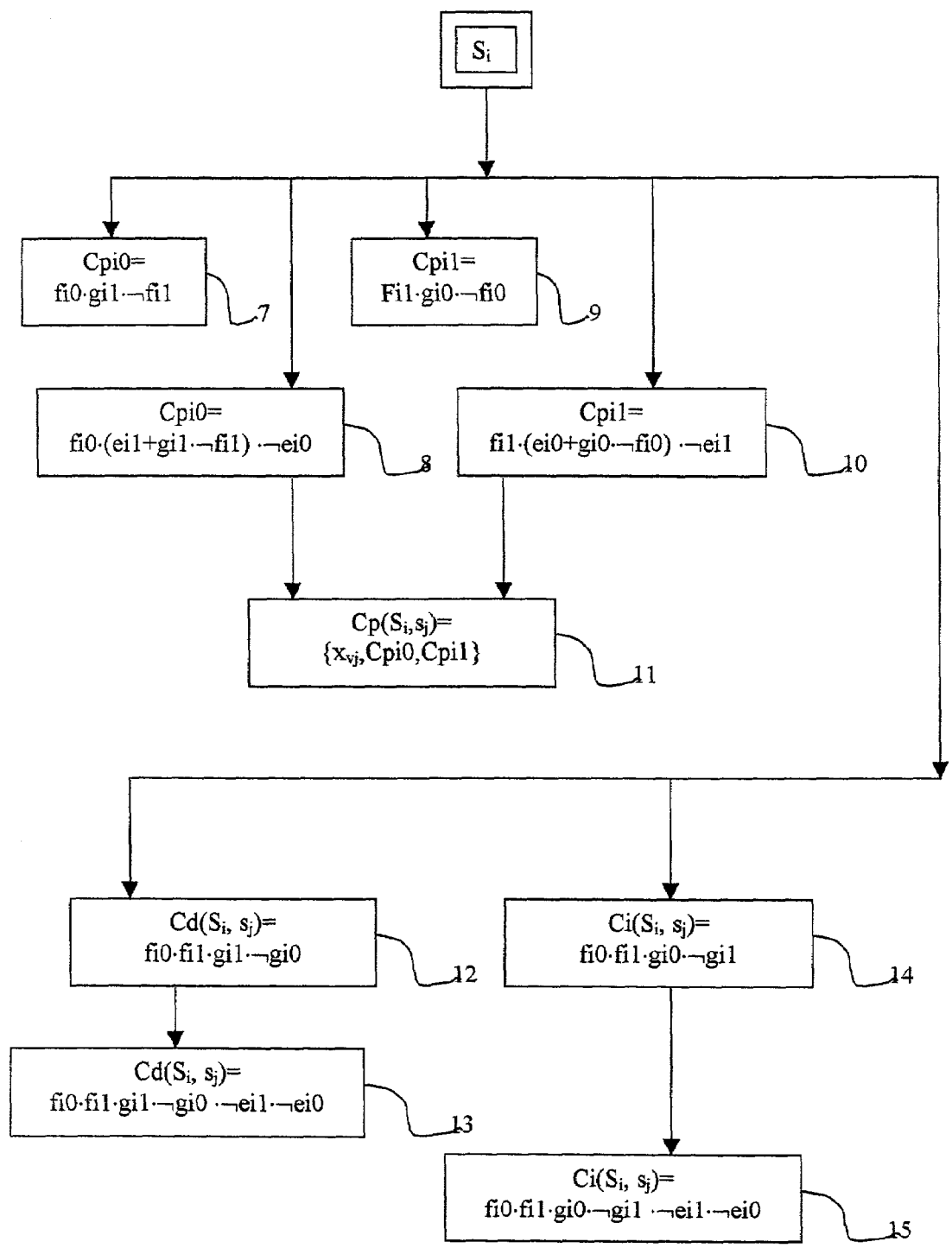
FIG. 2 represents steps of a method for associating with the first signal another binary decision diagram for which a change in the state of a second signal causes a change in the state of the first signal with a given state of a set of third signals.

FIG. 2 represents steps of the method for indicating, in connection with a physical element generating a first signal ($S_{11}$) as a function of a second signal ($S_5$) and third signals ($S_6$, $S_7$, $S_8$), a combination of states of said third signals such that a state change of said second signal changes said first signal from a binary state to a nonbinary state.

Associated with a signal $S_i$ are two or three binary decision diagrams $T_c(S_i)=\{x_{vj},fi0,fi1\}$, $T_v(S_i)=\{x_{vj},gi0,gi1\}$, $T_e(S_i)=\{x_{vj},ei0,ei1\}$, wherein fi0, gi0, ei0 are pointers in binary decision subdiagrams when $x_{vj}$ is equal to 0, and wherein fi1, gi1, ei1 are pointers in binary decision subdiagrams when $x_{vj}$ is equal to 1, $x_{cj}$ being in all cases considered equal to 1, since in this case only the binary states B, H of the signal $s_j$ with which the variable $x_{vj}$ is associated are considered. For simplicity's sake, these pointers will be likened to the binary decision subdiagrams to which they point. The method described is valid for any signal $S_k$ with which a variable $x_{vk}$ is associated by re-ordering, in a known way, the binary decision diagrams so to move $x_{vk}$ up to the root of the binary decision diagram.

The values at 1 in the binary decision subdiagram fi0 encode combinations of variables $x_{vn}$, for which the variable $x_{ci}$ has the value 1, which means that the signal $S_i$ is in one of the binary states B or H when the variable $x_{vj}$ has the value 0.

The values at 1 in the binary decision subdiagram fi1 encode combinations of variables $x_{vn}$ for which the variable $x_{ci}$ has the value 1, which means that the signal $S_i$ is in one of the binary states B or H when the variable $x_{vj}$ has the value 1.

The values at 1 in the binary decision subdiagram gi0 encode combinations of variables $x_{vn}$ for which the variable $x_{vi}$ has the value 1, which means that the signal $S_i$ is in the binary state H or in the nonbinary state Z when the variable $x_{vj}$ has the value 0.

The values at 1 in the binary decision subdiagram gi1 encode combinations of variables $x_{vn}$ for which the variable $x_{vi}$ has the value 1, which means that the signal $S_i$ is in the binary state H or in the nonbinary state Z when the variable $x_{vj}$ has the value 1.

The values at 1 in the binary decision subdiagram ei0 encode combinations of variables $x_{vn}$ for which the variables $x_{ci}$, $x_{vi}$ have the value 0, which means that the signal $S_i$ is in an indeterminate state like the nonbinary state E when the variable $x_{vj}$ has the value 0.

The values at 1 in the binary decision subdiagram ei0 encode combinations of variables $x_{vn}$ for which the variables $x_{ci}$, $x_{vi}$ have the value 0, which means that the signal $S_i$ is in an indeterminate state like the nonbinary state E when the variable $x_{vj}$ has the value 1.

In the remainder of the description, the symbol ¬ placed before a reference of a binary decision diagram indicates that the binary decision diagram is complemented in the known way according to the above.

A step 8 generates a binary decision subdiagram Cpi0 by combining the binary decision subdiagrams mentioned above using the formula:

$$Cpi0=fi0 \cdot \neg ei0 \cdot (ei1+gi1 \cdot \neg fi1).$$

The combination $gi1 \cdot \neg fi1$ encodes combinations of variables $x_{vn}$ for which the variable $x_{vi}$ has the value 1, which means that the signal $S_i$ is in the binary state H or in the nonbinary state Z, and for which the variable $x_{ci}$ does not have the value 1, which means that the signal $S_i$ is not in one of the binary states B or H when the variable $x_{vj}$ has the value 1. The disjunction of this combination with ei1 thus encodes the combinations of variables $x_{vn}$ for which the signal $S_i$ is not in one of the binary states B or H when the variable $x_{vj}$ has the value 1. The combination fi0·¬ei0 encodes combinations of variables $x_{vn}$ for which the variable $x_{vi}$ has the value 1, which means that the signal $S_i$ is in the binary state H or in the nonbinary state Z, and for which the variable $x_{ci}$ does not have the value 0, which means that the signal $S_i$ is not in a nonbinary state, when the variable $x_{vj}$ has the value 0. The disjunction of this last combination with ei1 thus encodes the combinations of variables $x_{vn}$ for which the signal $S_i$ is in one of the binary states B or H when the variable $x_{vj}$ has the value 0, and is not in one of the binary states B or H when the variable $x_{vj}$ has the value 1.

The values at 1 in Cpi0 correspond to a set of combinations of values $x_{vn}$ for which $S_i$ is in a binary state when $x_{vj}$ is not at the value 1, and for which $S_i$ is not in a binary state when $x_{vj}$ is in the value 1.

Thus, for the combinations at 1 of the variables $x_{vn}$, the signal $S_i$ changes from a binary state to a nonbinary state when the signal $S_j$ changes from the first state B to the second state H.

When the physical element is such that the state of the signal $S_i$ is never indeterminate, the binary decision subdiagram $e_{11}$ is always at 0 and the binary decision subdiagram ¬$e_{10}$ is always at 1. These binary decision subdiagrams have not been taken into consideration in a step 7, which in this case uses the following simplified formula for generating the binary decision subdiagram Cpi0:

$Cpi0 = fi0 \cdot gi1 \cdots \neg fi1$).

A step 10 generates a binary decision subdiagram Cpi1 by combining the binary decision subdiagrams mentioned above using the formula:

$Cpi1 = fi1 \cdots \neg ei1 \cdot (ei0 + gi0 \cdots \neg fi0)$.

The combination gi0·¬fi0 encodes combinations of variables $x_{vn}$ for which the variable $x_{vi}$ has the value 1, which means that the signal $S_i$ is in the binary state H or in the nonbinary state Z, and for which the variable $x_{ci}$ does not have the value 1, which means that the signal $S_i$ is not in one of the binary states B or H when the variable $x_{vj}$ has the value 0. The disjunction of this combination with ei0 thus encodes the combinations of variables $x_{vn}$ for which the signal $S_i$ is not in one of the binary states B or H when the variable $x_{vj}$ has the value 0. The combination fi1·¬ei1 encodes combinations of variables $x_{vn}$ for which the variable $x_{vi}$ has the value 1, which means that the signal $S_i$ is in the binary state H or in the nonbinary state Z, and for which the variable $x_{ci}$ does not have the value 0, which means that the signal $S_i$ is not in a nonbinary state, when the variable $x_{vj}$ has the value 1. The disjunction of this last combination with ei0 thus encodes the combinations of variables $x_{vn}$ for which the signal $S_i$ is in one of the binary states B or H when the variable $x_{vj}$ has the value 1, and is not in one of the binary states B or H when the variable $x_{vj}$ has the value 0.

The values at 1 of Cpi1 correspond to a set of combinations of values $x_{vn}$ for which $S_i$ is in a binary state when $x_{vj}$ is not at the value 0, and for which $S_i$ is not in a binary state when $x_{vj}$ is at the value 0.

Thus, for the combinations at 1 of the variables $x_{vn}$, the signal $S_i$ changes from a binary state to a nonbinary state when the signal $S_j$ changes from the second state H to the first state B.

When the physical element is such that the state of the signal $S_i$ is never indeterminate, the binary decision subdiagram $e_{11}$ is always at 0 and the binary decision subdiagram ¬$e_{10}$ is always at 1. These binary decision subdiagrams have not been taken into consideration in a step 9, which in this case uses the following simplified formula for generating the binary decision subdiagram Cpi1:

$Cpi1 = fi1 \cdot gi0 \cdots \neg fi0$).

A step 11 generates a binary decision diagram Cp(Si,sj) with the variable $x_{vj}$ at its root, a left branch equal to the subdiagram Cpi0 and a right branch equal to the subdiagram Cpi1. The values at 1 of this binary decision subdiagram encode the combinations of signals $S_n$ for which a binary state change of the signal $S_j$ changes the signal $S_i$ from a binary state to a nonbinary state.

A step 13 generates a binary decision subdiagram Cdi0 by combining the binary decision subdiagrams mentioned above using the formula:

$Cdi0 = fi0 \cdots \neg gi0 \cdots \neg ei0 \cdot fi1 \cdot gi1 \cdot \neg ei1$.

The combination gi1·fi1 encodes combinations of variables $x_{vn}$ for which the variable $x_{vi}$ has the value 1, which means that the signal $S_i$ is in the binary state H or in the nonbinary state Z, and for which the variable $x_{ci}$ has the value 1, which means that the signal $S_i$ is in the binary state H when the variable $x_{vj}$ has the value 1. The conjunction of this combination with ¬ei1 thus encodes the combinations of variables $x_{vn}$ for which the signal $S_i$ is in the binary state H when the variable $x_{vj}$ has the value 1. The combination fi0·¬ei0 encodes combinations of variables $x_{vn}$ for which the variable $x_{vi}$ has the value 1, which means that the signal $S_i$ is in the binary state H or in the binary state B, and for which the variable $x_{ci}$ does not have the value 0, which means that the signal $S_i$ is not in a nonbinary state, when the variable $x_{vj}$ has the value 0. The conjunction of this last combination with ¬gi0 thus encodes the combinations of variables $x_{vn}$ for which the signal $S_i$ is in the binary state B when the variable $x_{vj}$ has the value 0, and is not in a nonbinary state when the variable $x_{vj}$ has the value 0.

The values at 1 of Cdi0 correspond to a set of combinations of values $x_{vn}$ for which $S_i$ is in a binary state B when $x_{vj}$ is not at the value 0, and for which $S_i$ is in a binary state H when $x_{vj}$ is at the value 1.

Thus, for the combinations at 1 of the variables $x_{vn}$, the signal $S_i$ changes from a binary state B to a binary state H when the signal $S_j$ changes from the first state B to the second state H. Symmetrically, the signal $S_i$ changes from a binary state H to a binary state B when the signal $S_j$ changes from the first state B to the second state H.

When the physical element is such that the state of the signal $S_i$ is never indeterminate, the binary decision subdiagram $e_{11}$ is always at 0 and the binary decision subdiagram ¬$e_{10}$ is always at 1. These binary decision subdiagrams have not been taken into consideration in a step 12, which in this case uses the following simplified formula for generating the binary decision subdiagram Cdi0:

$Cdi0 = fi0 \cdots \neg gi0 \cdot fi1 \cdot gi1 \cdot$.

A step 15 generates a binary decision subdiagram Cii($s_i$,$s_j$) by combining the binary decision subdiagrams mentioned above using the formula:

$Cii(s_i,s_j) = fi0 \cdots \neg gi1 \cdots \neg ei0 \cdot fi1 \cdot gi0 \cdots \neg ei1$.

The combination gi0 fi0 encodes combinations of variables $x_{vn}$ for which the variable $x_{vi}$ has the value 1, which means that the signal $S_i$ is in the binary state H when the variable $x_{vj}$ has the value 0. The conjunction of this combination with ¬ei1 thus encodes the combinations of variables $x_{vn}$ for which the signal $S_i$ is not in an indeterminate state when the variable $x_{vj}$ does not have the value 0. The combination fi1·¬gi1 encodes combinations of variables $x_{vn}$ for which the variable $x_{vi}$ has the value 0, which means that the signal $S_i$ is in the binary state B when the variable $x_{vj}$ has the value 1. The conjunction of this last combination with ¬ei0 thus encodes the combinations of variables $x_{vn}$ for which the signal $S_i$ is not in an indeterminate state, when the variable $x_{vj}$ does not have the value 1.

The values at 1 of $Cii(S_i,S_j)$ correspond to a set of combinations of values $x_{vn}$ for which $S_i$ is in a binary state H when $x_{vj}$ is at the value 0, and for which $S_i$ is in a binary state B when $x_{vj}$ is at the value 1.

Thus, for the combinations at 1 of the variables $x_{vn}$, the signal $S_i$ changes from a binary state H to a binary state B when the signal $S_j$ changes from the first state B to the second state H. Symmetrically, the signal $S_i$ changes from a binary state B to a binary state H when the signal $S_j$ changes from the second state H to the first state H.

When the physical element is such that the state of the signal $S_i$ is never indeterminate, the binary decision subdiagram $e_{11}$ is always at 0 and the binary decision subdiagram ¬$e_{10}$ is always at 1. These binary decision subdiagrams have not been taken into consideration in a step 14, which in this case uses the following simplified formula for generating the binary decision subdiagram $Cii(S_i,S_j)$:

$$Cii(S_i,S_j)=fi0·\neg gi1·fi1·gi0.$$

Steps 7 through 15 have in common the generation of a binary decision diagram wherein the values at 1 correspond to a first state of the signal $S_i$ when $x_{vj}$ is at a first value and to a second, different state when $x_{vj}$ is not at the first value.

Returning to the elementary circuit of FIG. 3, the three binary decision diagrams are developed recursively from each of the binary decision diagrams $T_c(S_5)$, $T_c(S_6)$, $T_c(S_7)$, $T_c(S_8)$, $T_c(S_9)$, $T_c(S_{10})$ valued at 1, and from each of the binary decision diagrams $T_v(S_5)$, $T_v(S_6)$, $T_v(S_7)$, $T_v(S_8)$, $T_v(S_9)$, $T_v(S_{10})$, respectively replaced by each of the binary decision diagrams $\{x_{v5};0;1\}$, $\{x_{v6};0;1\}$, $\{x_{v7};0;1\}$, $\{x_{v8};0;1\}$, $\{x_{v9};0;1\}$, $\{x_{v10};0;1\}$. Thus we obtain, in alphanumeric order:

For $S_4$:

$$Tv(s4)=[Tc(s9)·\overline{Tv(s9)}·Tv(s10)+Tc(s9)·Tv(s9)]$$

$$Tv(S_4)=\{x_{v9};\{x_{v10};0;1\};0\}+\{x_{v9};0;1\}$$

$$Tv(S_4)=\{x_{v9};\{x_{v10};0;1\};1\}$$

$$Tc(s4)=Tc(s9)·\overline{Tv(s9)}·Tc(s10)$$

$$Tc(S_4)=\{x_{v9};1;0\}$$

$$T_e(S_4)=\{0\}$$

For $S_3$:

$$Tv(s3)=[Tc(s7)·Tv(s7)·Tv(s8)+Tc(s7)·\overline{Tv(s7)}]$$

$$Tv(S_3)=\{x_{v7};0;\{x_{v8};0;1\}\}+\{x_{v7};1;0\}$$

$$Tv(S_3)=\{x_{v7};1;\{x_{v8};0;1\}\}$$

$$Tc(s3)=Tc(s7)·Tv(s7)·Tc(s8)$$

$$Tc(S_3)=\{x_{v7};0;1\}$$

$$T_e(S_3)=\{0\}$$

For $S_2$:

$$Tv(S2)=\{x_{v5};1;\{x_{v6};0;1\}\}$$

$$Tc(S_2)=\{x_{v5};0;1\}$$

$$T_e(S_2)=\{0\}$$

For $S_{11}$:

$$Tc(s11)=+Tc(s2)·[\overline{Tc(s3)}+\overline{Tv(s2)}·\overline{Tv(s3)}+Tv(s2)·Tv(s3)]+Tc(s3)·[\overline{Tc(s2)}+\overline{Tv(s2)}·\overline{Tv(s3)}+Tv(s2)·Tv(s3)]$$

Figure 5:
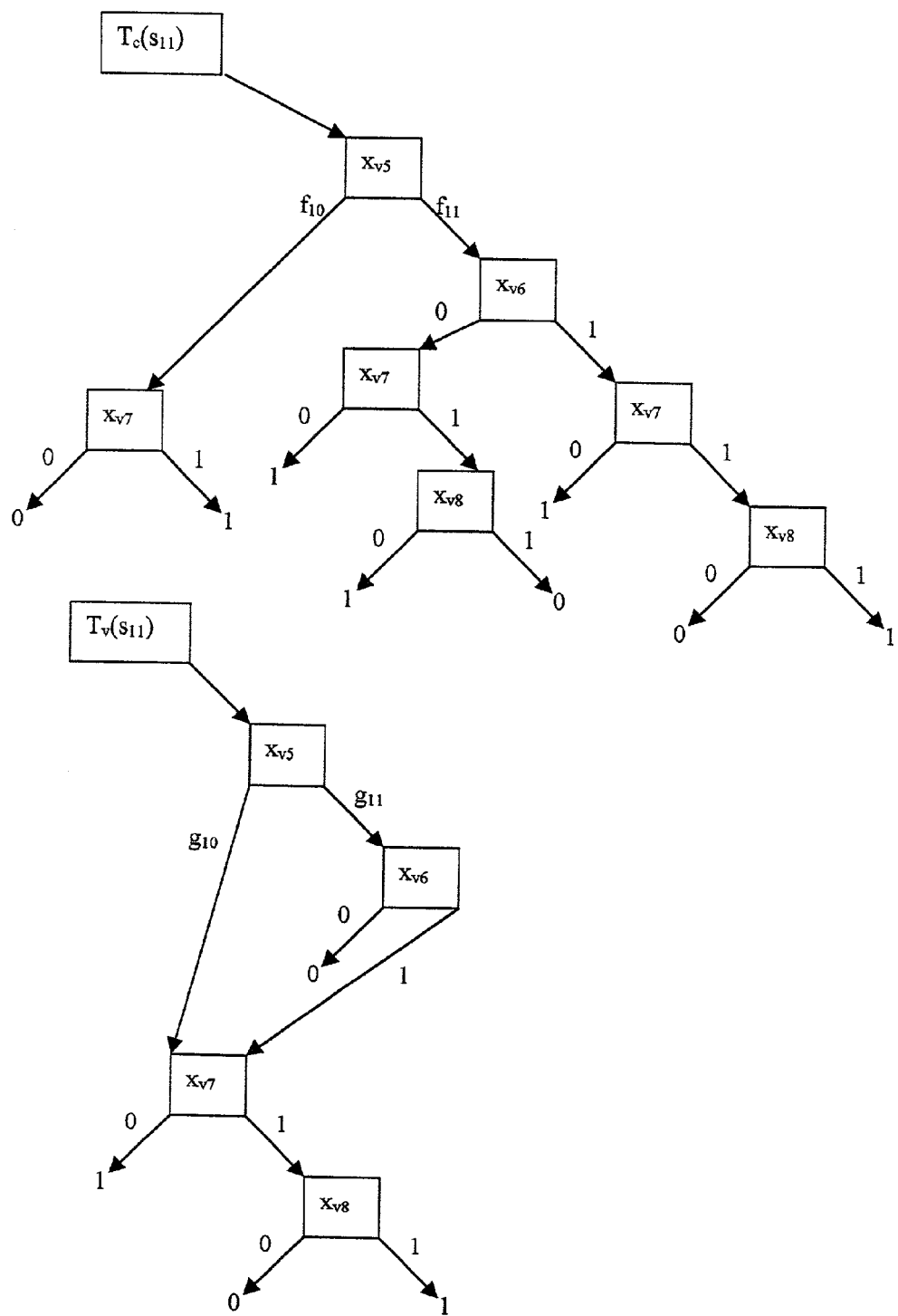
FIG. 5 represents two binary decision diagrams obtained using the method of FIG. 1, for the physical element of FIG. 3.

The rules for combining binary decision diagrams yield the binary decision diagram $Tc(S_{11})$ represented in FIG. 5, i.e. a triplet $\{x_{v5};f_{10};f_{11}\}$ Where $f_{10}$ is a pointer in a binary decision subdiagram $\{x_{v7};0;1\}$ and where $f_{11}$ is a pointer in a binary decision subdiagram.

$$\{x_{v6};\{x_{v7};1;\{x_{v8};1;0\}\};\{x_{v7};1;\{x_{v8};0;1\}\}\}$$

$$T_v(S_{11})=T_v(S_2)·T_v(S_3).$$

The rules for combining binary decision diagrams yield the binary decision diagram $Tc(S_{11})$ represented in FIG. 5, i.e. a triplet $\{x_{v5};f_{10};f_{11}\}$ Where $g_{10}$ is a pointer in a binary decision subdiagram $\{x_{v7};1;\{x_{v8};0;1\}\}$ and where $g_{11}$ is a pointer in a binary decision subdiagram $\{x_{v6};0;\{x_{v7};1;\{x_{v8};0;1\}\}\}$.

$$Te(s11)=Tc(s2)·Tc(s3)·\lfloor Tv(s2)·\overline{Tv(s3)}+\overline{Tv(s2)}·Tv(s3)\rfloor+Te(s2)+Te(s3)$$

Figure 6:
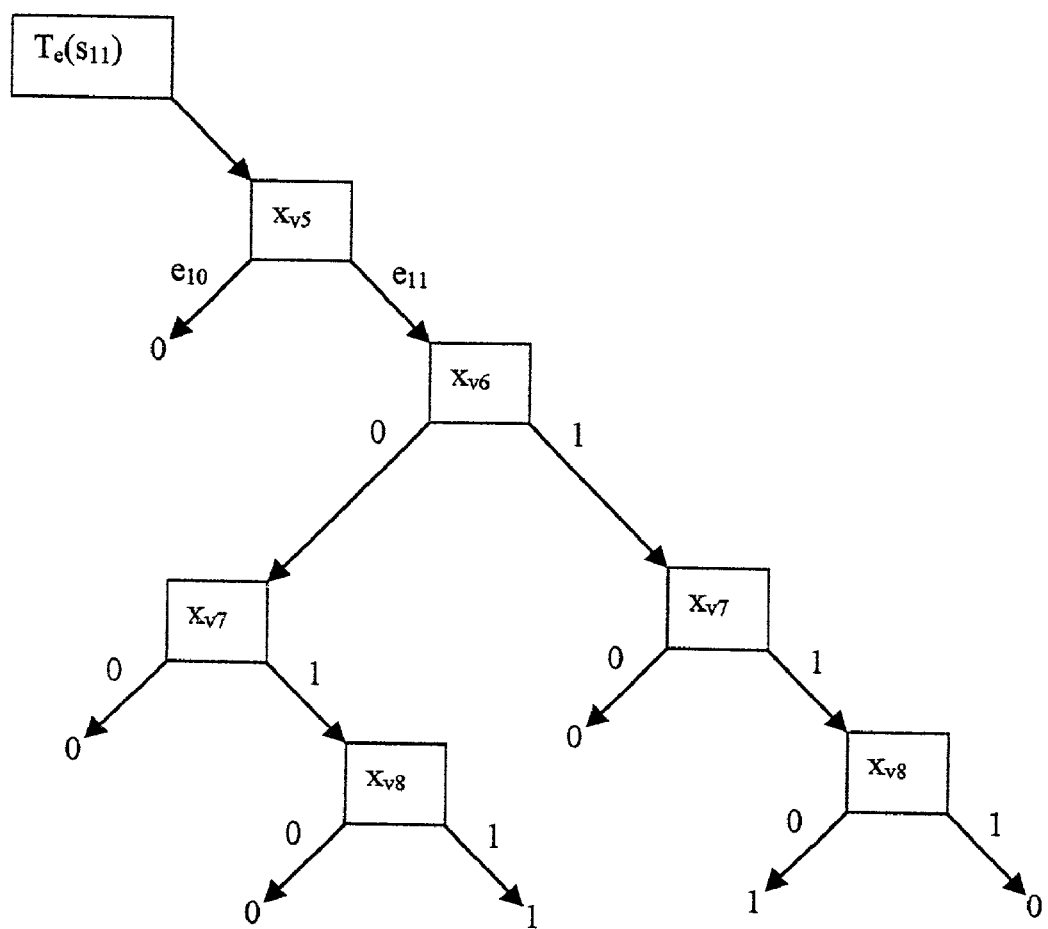
FIG. 6 represents a third binary decision diagram obtained using the method of FIG. 1, for the physical element of FIG. 3.

The rules for combining binary decision diagrams yield the binary decision diagram $Te(S_{11})$ represented in FIG. 6, i.e. a triplet $\{x_{v5};e_{10};e_{11}\}$ Where $e_{10}$ is a pointer in a binary decision subdiagram $\{0\}$ and where $e_{11}$ is a pointer in a binary decision subdiagram $\{x_{v6};\{x_{v7};0;\{x_{v8};0;1\}\}; \{x_{v7};0;\{x_{v8};1;0\}\}\}$.

The binary decision subdiagram $Cp(S_{11},S_5)=\{x_{v5};cp_{10};cp_{11}\}$ is generated in step 11 with:

$$cp10=f10·\overline{e10}·(e11+\overline{f11}·g11)$$

When applying the rules for combining binary decision diagrams, $cp_{10}$ points to a binary decision subdiagram $\{x_{v6};\{x_{v7};0;\{x_{v8};0;1\}\}; \{x_{v7};0;\{x_{v8};1;0\}\}\}$.

$$cp11=f11·\overline{e11}·(e10+\overline{f10}·g10)$$

When applying the rules for combining binary decision diagrams, cp 11 points to a binary decision subdiagram $\{x_{v6};\{x_{v7};1;\{x_{v8};1;0\}\};0\}$.

Figure 7:
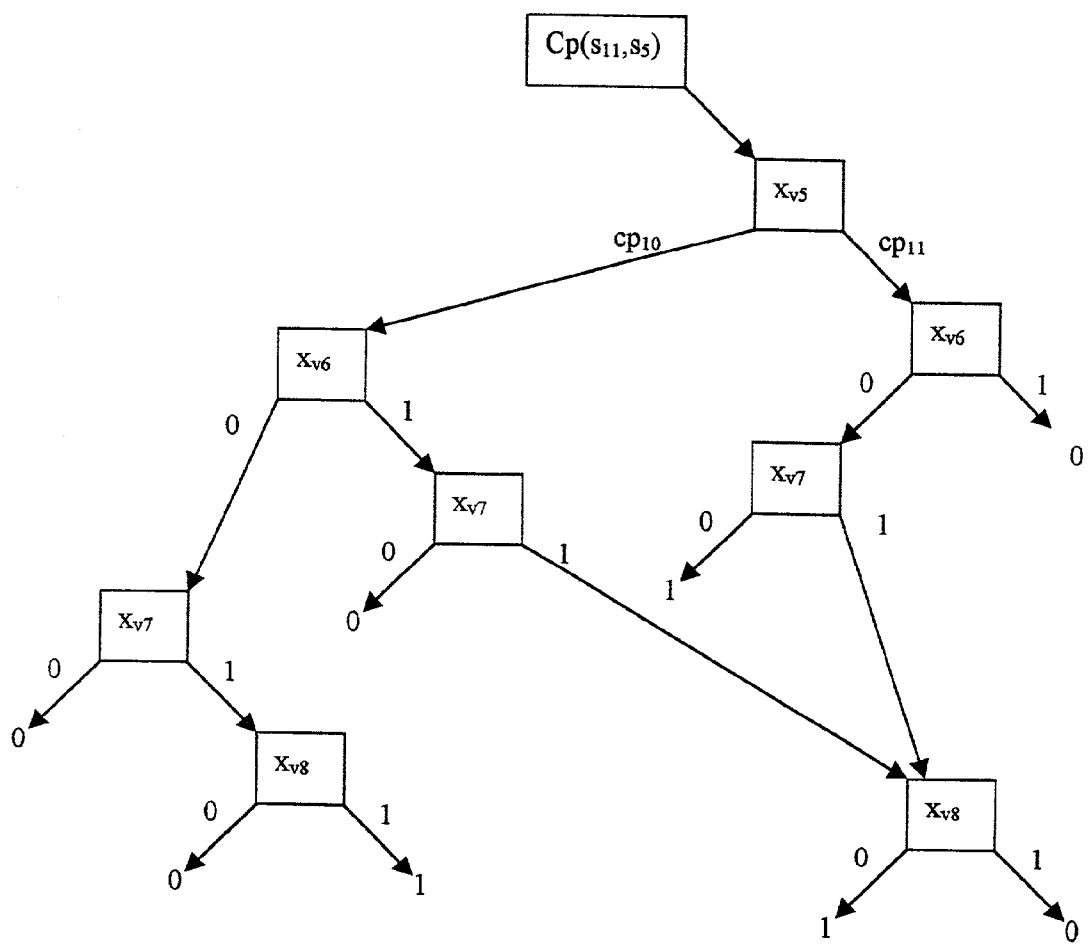
FIG. 7 represents an exemplary binary decision diagram obtained using the method according to the invention.
Figure 8:
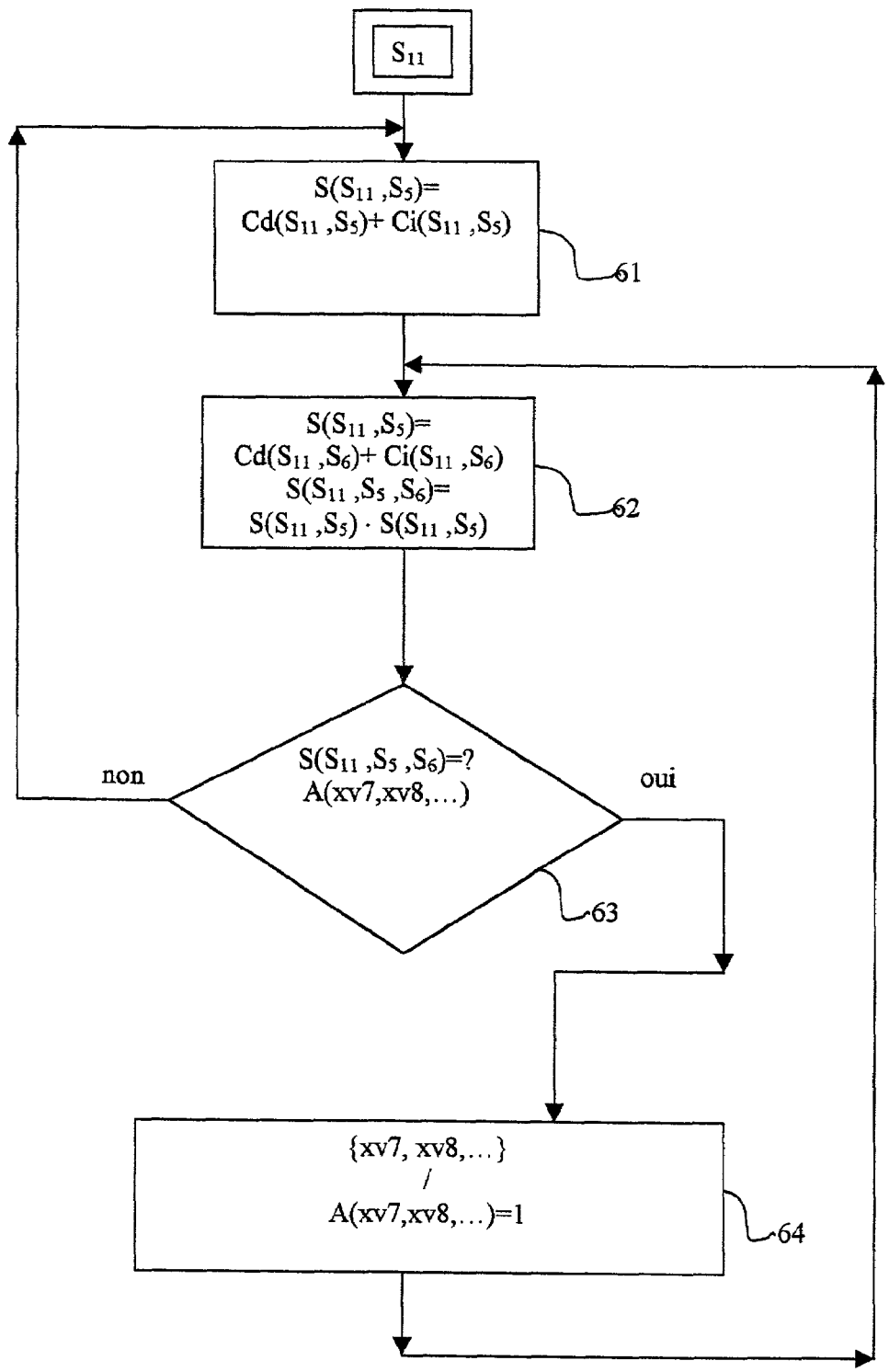
FIG. 8 presents additional steps of a method according to the invention.

Which results in the binary decision diagram $Cp(S_{11},S_5)$ represented in FIG. 7.

A scan of the branches of the binary decision diagram $Cp(S_{11},S_5)$ that lead to the value 1 yields the following logical combinations of variables:

for $v_{v5}$ initially at zero:

$$\overline{xv6}·xv7·xv8+xv6·xv7·\overline{xv8}=1$$

for $x_{v5}$ initially equal to 1:

$$\overline{xv6}·\overline{xv7}+\overline{xv6}·xv7·\overline{xv8}=1$$

When a binary state is applied to each of the signals $S_5$, $S_6$, $S_7$, $S_8$, the variables $x_{c5}$ $x_{c6}$ $x_{c7}$ $x_{c8}$ all have the value 1, and the values at 0, and respectively the values at 1, of the variables $x_{c5}$ $x_{c6}$ $x_{c7}$ $x_{c8}$ represent the states B, and respectively H, of the signals $S_5$, $S_6$, $S_7$, $S_8$.

The first combination indicates that when the set of signals $\{S_6, S_7, S_8\}$ is set to the states $\{B, H, H\}$ or respectively $\{H, B, B\}$, the change of the signal $S_5$ from a state B to H changes the signal $S_{11}$ from a binary state, in this case H or respectively B, to a nonbinary state, in this case an error state.

The second combination indicates that when the set of signals $\{S_6, S_7\}$ is set to the states $\{B, B\}$, or respectively when the set of signals {$S_6$, $S_7$, $S_8$} is set to the states {B, H B}, the change of the signal $S_5$ from a state H to B, changes the signal $S_{11}$ from a binary state, in this case B, to a nonbinary state, in this case a high-impedance state, or respectively an error state.

Steps 12 and 14 or 13 and 15 of the method described above make it possible to obtain, for an output signal $S_{11}$, a direct context binary decision diagram $Cd(S_{11}, S_5)$ and an inverse context binary decision diagram $Ci(S_{11}, S_5)$ for each input signal $S_5$ on which the signal $S_{11}$ depends.

A scan of each branch of the direct context binary decision diagram $Cd(S_{11}, S_5)$ that leads to 1 yields a logical conjunction of binary states of signals $S_6$, $S_7$, $S_8$, etc., for which a binary state change of the signal $S_5$ is sensed to cause the same binary state change of the signal $S_{11}$, A scan of each branch of the inverse context binary decision diagram $Ci(S_{11}, S_5)$ that leads to 1 yields a logical conjunction of binary states of signals $S_6$, $S_7$, $S_8$, etc., for which a binary state change of the signal $S_5$ is sensed to cause an inverse binary state change of the signal $S_{11}$ By applying a combination of binary states to the signals $S_6$, $S_7$, $S_8$, etc., in a material sample of the circuit tested, in such a way that a logical conjunction found in the preceding paragraph is at 1, a detection of a behavior of the output signal $S_{11}$ that does not match the binary state change sensed to have been caused by a binary state change test of the signal $S_5$, indicates a fault in this material sample. A material sample for which a fault is indicated must be declared unfit for use.

By repeating the preceding operation with $S_6$, $S_7$, $S_8$, etc., as a test signal, it is possible to make sure that the behavior of the signal $S_{11}$ matches a binary state change of each of the signals $S_6$, $S_7$ $S_8$.

In order to reduce the number of input signals to be tested, the method advantageously includes the following additional steps.

In a step 61, a binary decision diagram $S(_{11}, S_5)$ is constructed as being a logical disjunction of the direct $Cd(S_{11}, S_5)$ and inverse $Ci(S_{11}, S_5)$ context binary decision diagrams.

$$S(S_{11}, S_5) = Cd(S_{11}, S_5) + Ci(S_{11}, S_5)$$

In a step 62, for a signal $S_6$, a binary decision diagram $S(_{11}, S_6)$ is constructed as being a logical disjunction of the direct $Cd(S_{11}, S_6)$ and inverse $Ci(S_{11}, S_6)$ context binary decision diagrams.

$$S(S_{11}, S_6) = Cd(S_{11}, S_6) + Ci(S_{11}, S_6)$$

for the pair of signals $S_5$, $S_6$, a binary decision diagram $S(S_{11}, S_5, S_6)$ is constructed as being a logical conjunction of the binary decision diagrams $S(S_{11}, S_5)$ and $S(S_{11}, S_6)$ $$S(S_{11}, S_5, S6) = S(S_{11}, S5) \cdot S(S_{11}, S_6)$$

In a step 63, the binary decision diagram $S(S_{11}, S_5, S_6)$ is ordered so as to begin with the variables $xv_5$, $xv_6$. If the binary decision diagram $S(S_{11}, S_5, S_6)$ exists in the form of a binary decision diagram $a(xv_7, xv_8, \ldots)$ independent of $xv_5$ and $xv_6$, the branches of the binary decision diagram $a(xv_7, xv_8, \ldots)$ are scanned in a step 64. The first branch that leads to 1 yields a logical conjunction of binary states of signals $S_7$, $S_8$, etc., for which a binary state change of the signal $S_5$ is sensed to cause a binary state change of the signal $S_{11}$ and for which a binary state change of the signal $S_6$ is sensed to cause a binary state change of the signal $S_{11}$. In essence, with the construction of $S(S_{11}, S_5, S6)$, the logical conjunction of binary states of signals $S_7$, $S_8$, etc., thus found simultaneously verifies $S(S_{11}, S_5)$ and $S(S_{11}, S_6)$.

By applying a combination of binary states to the signals $S_7$, $S_8$, etc., in a material sample of the circuit tested, in such a way that a logical conjunction found in the preceding paragraph is at 1, a detection of a behavior of the output signal $S_{11}$ that does not match the binary state change sensed to have been caused by a binary state change test of the signal $S_5$, or a detection of a behavior of the output signal $S_{11}$ that does not match the binary state change sensed to have been caused by a binary state change test of the signal $S_6$, indicates a fault in this material sample. A material sample for which a fault is indicated must be declared unfit for use.

Thus, the same binary state profile of signals $S_7$, $S_8$, etc., makes it possible to test whether the change of the signal $S_{11}$ matches both signals S5 and $S_6$. When such a profile is found by executing steps 61 through 63, a it saves time in the testing of a material sample of the circuit, since this same profile makes it possible to test the change of two different input signals.

If the binary decision diagram $S(S_{11}, S_5, S_6)$ is not present in step 63 in the form of a binary decision diagram $a(xv_7, xv_8, \ldots)$ independent of $xv_5$ and $xv_6$, the signal $S_6$ is saved in an auxiliary list in order to apply step 61 to it, wherein the signal $S_6$ replaces the signal $S_5$, so as to detect any equivalent faults with other signals $S_7$, $S_8$.

After step 64, as long as there are signals $S_7$, $S_8$, etc. on which the signal $S_{11}$ depends, steps 62 and 63 are repeated, in which each of the signals $S_7$, $S_8$, etc. in turn replaces the signal $S_6$.

This makes it possible to find a common profile for all the signals that positively verify step 63 for a given signal $S_8$. This common profile makes it possible to reduce the duration of the testing of a material sample of the circuit for these input signals.

While this invention has been described in conjunction with specific embodiments thereof, it is evident that many alternatives, modifications and variations will be apparent to those skilled in the art. Accordingly, the preferred embodiments of the invention as set forth herein, are intended to be illustrative, not limiting. Various changes may be made without departing from the true spirit and full scope of the invention as set forth herein and defined in the claims.

We claim:

1. A method for indicating, in connection with a physical element generating a first signal as a function of a second signal and a plurality of third signals, a combination of states of said third signals such that a state change of said second signal changes said first signal from a binary state to a nonbinary state, wherein two binary decision diagrams are associated with said first signal, and wherein
   a first binary decision diagram includes a first binary decision subdiagram that encodes a first set of the combinations of binary states of the third signals for which the first signal is in a first binary state or in a second binary state when the second signal is in the first binary state, and a second binary decision subdiagram that encodes a second set of the combinations of binary states of the third signals for which the first signal is in the first binary state or in the second binary state when the second signal is in the second binary state, and
   a second binary decision diagram includes a third binary decision subdiagram that encodes a third set of the combinations of binary states of the third signals for which the first signal is in the second binary state or in a first nonbinary state when the second signal is in the first binary state and a fourth binary decision subdiagram that encodes a fourth set of the combinations of binary states of the third signals for which the first signal is in the second binary state or in the first nonbinary state when the second signal is in the second binary state said method comprising:

a first step that includes forming a first logical combination of the first, second and fourth binary decision subdiagrams, in order to generate a fifth binary decision subdiagram that encodes a fifth set of combinations of states of said third signals, for which the first signal is in a first binary state or a second binary state when the second signal is in the first binary state, the first signal is not in the first binary state or the second binary state when the second signal is in the second binary state, and the first signal is in the second binary state or in the first nonbinary state when the second signal is in the second binary state, so that a change of said second signal, viewed as a control signal with reverse polarity, from the second binary state to the first binary state changes said first signal from a binary state to the first nonbinary state.

2. A method according to claim 1, wherein a third binary decision diagram is associated with said first signal, wherein the third binary decision diagram includes a sixth binary decision subdiagram that encodes a sixth set of the combinations of binary states of the third signals for which the first signal is in a second nonbinary state when the second signal is in the first binary state (B), and a seventh binary decision subdiagram that encodes a seventh set of the combinations of binary states of the third signals for which the first signal is in a second nonbinary state when the second signal is in the second binary state, and wherein said method further comprises:

a second step that includes forming a second logical combination of the first, second, fourth, sixth and seventh binary decision subdiagrams, in order to generate the fifth binary decision subdiagram which encodes an eighth set of combinations of states of said third signals, wherein the first signal is in the second binary state or in the first nonbinary state when the second signal is in the second binary state and the first signal is not in the first binary state or in the second binary state when the second signal is in the second binary state or the first signal is in the second nonbinary state when the second signal is in the second binary state, and wherein the first signal is in the first binary state or in the second binary state when the second signal is in the first binary state and the first signal is not in the second nonbinary state when the second signal is in the first binary state, so that a change of said second signal, viewed as a control signal with reverse polarity, from the second binary state to the first binary state changes said first signal from a binary state to the first or the second nonbinary state.

3. A method according to claim 2, further comprising:

a third step that includes forming a third logical combination of the first, second and third binary decision subdiagrams, in order to generate an eighth binary decision subdiagram that encodes a ninth set of combinations of states of said third signals, for which the first signal is in a first binary state or in a second binary state when the second signal is in the second binary state, the first signal is not in the first binary state or in the second binary state when the second signal is in the first binary state, the first signal is in the second binary state or in the first nonbinary state when the second signal is in the first binary state, so that a change of said second signal, viewed as a control signal with reverse polarity, from the first binary state to the second binary state changes said first signal from a binary state to the first nonbinary state.

4. A method according to claim 3, further comprising:

a fourth step that includes forming a fourth logical combination of the first, second, third, sixth and seventh binary decision subdiagrams, in order to generate the eighth binary decision subdiagram which encodes a tenth set of combinations of states of said third signals, for which the first signal is in the second binary state or in the first nonbinary state when the second signal is in the first binary state and the first signal is not in the first binary state or in the second binary state when the second signal is in the first binary state or the first signal is in the second nonbinary state when the second signal is in the first binary state, and for which the first signal is in the first binary state or in the second binary state when the second signal is in the second binary state and the first signal is not in the second nonbinary state when the second signal is in the second binary state, so that a change of said second signal, viewed as a control signal with reverse polarity, from the first binary state to the second binary state changes said first signal from a binary state to the first or the second nonbinary state.

5. A method according to claim 4, further comprising:

a fifth step that includes forming a fourth binary decision diagram constituted by the fifth binary decision subdiagram when the second signal is in the first binary state and by the eighth binary decision subdiagram when the second signal is in the second binary state, so that a change of said second signal, viewed as control signal with reverse polarity, from the first binary state to the second binary state, or respectively of said second signal, viewed as a control signal with reverse polarity, from the first binary state to the second binary state, changes said first signal from a binary state to the second or the first nonbinary state.

6. A method according to claim 5, further comprising:

a sixth step that includes forming a fifth logical combination of the first, second third and fourth binary decision subdiagrams, in order to generate a fifth binary decision diagram that encodes an eleventh set of combinations of states of said third signals, for which the first signal is in a first binary state or in a second binary state when the second signal is in the first binary state, the first signal is in a first binary state or in a second binary state when the second signal is in the second binary state, the first signal is not in the first binary state or in the second binary state when the second signal is in the first binary state, and the first signal is in the second binary state or in the first nonbinary state when the second signal is in the second binary state, so that a change of said second signal, viewed as a control signal with reverse polarity, from the first binary state to the second binary state, or respectively from the second binary state to the first binary state, changes said first signal from the first binary state to the second binary state, or respectively from the second binary state to the first binary state.

7. A method according to claim 6, further comprising: a seventh step that includes forming a sixth logical combination of the fifth logical combination and the sixth and seventh binary decision subdiagrams, in order to generate the fifth binary decision diagram, which encodes a twelfth set of combinations of states of said third signals, for which the first signal is not in a second nonbinary state and the first signal is not in the second nonbinary state when the second signal is in the second binary state, so that a change of said second signal, viewed as a control signal with reverse polarity, from the first binary state to the second binary state, or respectively from the second binary state to the first binary state, changes said first signal from the first binary state to the second binary state, or respectively from the second binary state to the first binary state.

8. A method according to claim 7, further comprising:

an eighth step that includes forming a seventh logical combination of the first, second, third and fourth binary decision subdiagrams, in order to generate a sixth binary decision diagram that encodes a thirteenth set of combinations of states of said third signals for which the first signal is in a first binary state or in a second binary state when the second signal is in the first binary state, wherein the first signal is in a first binary state or in a second binary state when the second signal is in the second binary state, the first signal is in the first binary state or in the second binary state when the second signal is in the first binary state, the first signal is not in the second binary state or in the first nonbinary state when the second signal is in the second binary state, so that a change of said second signal, viewed as a control signal with reverse polarity, from the first binary state to the second binary state, or respectively from the second binary state to the first binary state, changes said first signal from the second binary state to the first binary state, or respectively from the first binary state to the second binary state.

9. A method according to claim 8, further comprising: a ninth step that includes forming an eighth logical combination of the seventh logical combination and the sixth and seventh binary decision subdiagrams, in order to generate the sixth binary decision diagram, which then encodes a fourteenth set of combinations of states of said third signals, for which the first signal is not in a second nonbinary state when the second signal is in the first binary state, and the first signal is not in the second nonbinary state when the second signal is in the second binary state, so that a change of said second signal, viewed as a control signal with reverse polarity, from the first binary state to the second binary state, or respectively from the second binary state to the first binary state, changes said first signal from the first binary state to the second binary state, or respectively from the second binary state to the first binary state.

10. A method according to claim 9, further comprising:

a tenth step that including forming a first logical disjunction of the fifth and sixth binary decision diagrams for a first input signal, an eleventh step that that includes forming a second logical disjunction of the fifth and sixth binary decision diagrams for a second input signal and that performs a logical conjunction of the first and second logical disjunctions, a twelfth step that includes scanning the binary decision diagram corresponding to the logical conjunction obtained in the eleventh step if said corresponding binary decision diagram depends on binary states of signals different from the signals, in order to obtain a logical conjunction of binary states of signals.

* * * * *

UNITED STATES PATENT AND TRADEMARK OFFICE
CERTIFICATE OF CORRECTION

| | |
|---|---|
| PATENT NO. | : 7,096,138 B2 |
| APPLICATION NO. | : 10/049021 |
| DATED | : August 22, 2006 |
| INVENTOR(S) | : Florence Akli, Alain Debreil and Christian Niquet |

It is certified that error appears in the above-identified patent and that said Letters Patent is hereby corrected as shown below:

Title Page, Item

(30) insert -- Foreign Application Priority Data

June 8, 2000   (FR)    0007355 --

Signed and Sealed this

Twenty-eighth Day of November, 2006

JON W. DUDAS
*Director of the United States Patent and Trademark Office*